(12) United States Patent
Yu et al.

(10) Patent No.: US 8,987,915 B1
(45) Date of Patent: Mar. 24, 2015

(54) SEMICONDUCTOR STRUCTURE AND MANUFACTURING METHOD THEREOF

(71) Applicant: Taiwan Semiconductor Manufacturing Company Ltd., Hsinchu (TW)

(72) Inventors: Chen-Hua Yu, Hsinchu (TW); Mirng-Ji Lii, Hsinchu County (TW); Chung-Shi Liu, Hsinchu (TW); Chang-Chia Huang, Hsinchu (TW); Chih-Wei Lin, Hsinchu (TW); Ming-Da Cheng, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/013,503

(22) Filed: Aug. 29, 2013

(51) Int. Cl.
*H01L 25/065* (2006.01)
*H01L 23/00* (2006.01)

(52) U.S. Cl.
CPC ............ *H01L 25/0652* (2013.01); *H01L 24/94* (2013.01)
USPC .......................................... 257/773; 438/107

(58) Field of Classification Search
CPC ............................. H01L 25/0652; H01L 24/94
USPC ............................................ 257/773; 438/107
See application file for complete search history.

(56) References Cited

U.S. PATENT DOCUMENTS 6,908,784 B1 * 6/2005 Farnworth et al. ............ 438/106

* cited by examiner

*Primary Examiner* — Roy Potter
*Assistant Examiner* — Paul Patton
(74) *Attorney, Agent, or Firm* — WPAT, P.C.; Anthony King; Kay Yang

(57) ABSTRACT

A method of manufacturing a semiconductor structure includes several operations. The several operations include placing a plurality of dies on a carrier; defining a first zone and a second zone in a top surface of the carrier; calculating a first coverage ratio in the first zone; calculating a second coverage ratio in the second zone; disposing a dummy block on a specified location of the top surface of the carrier if the difference between the first coverage ratio and the second coverage ratio is greater than a predetermined value; forming a molding compound on the carrier.

20 Claims, 29 Drawing Sheets

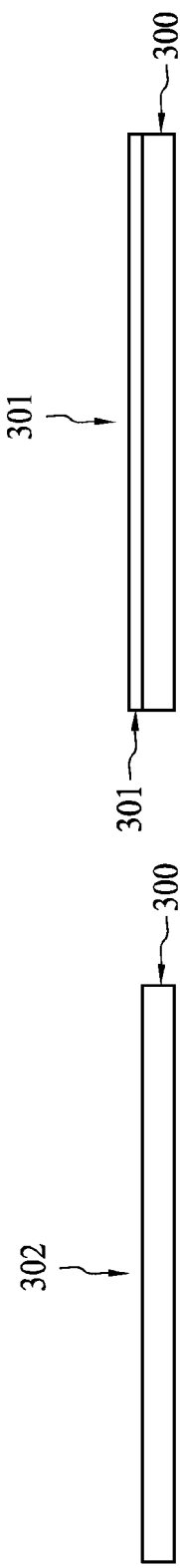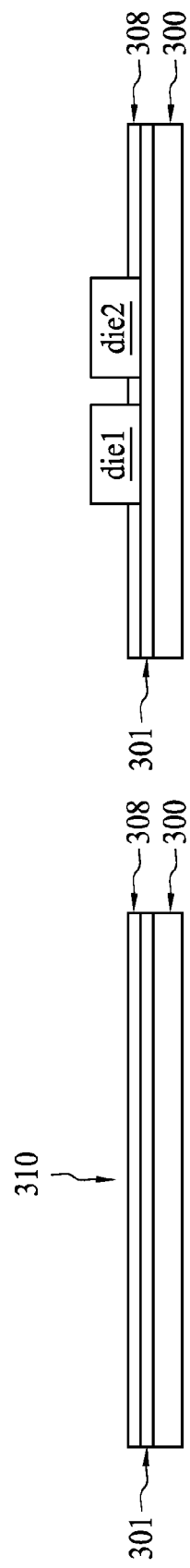

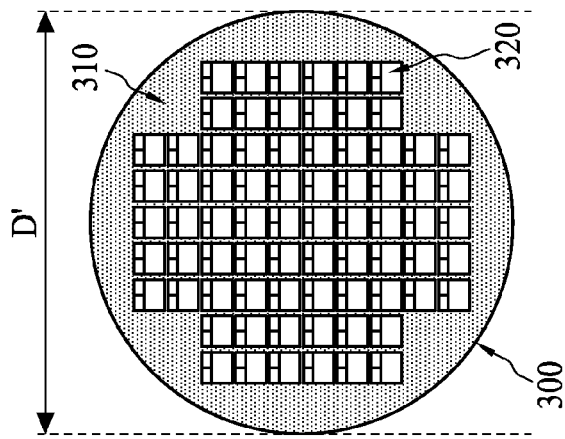
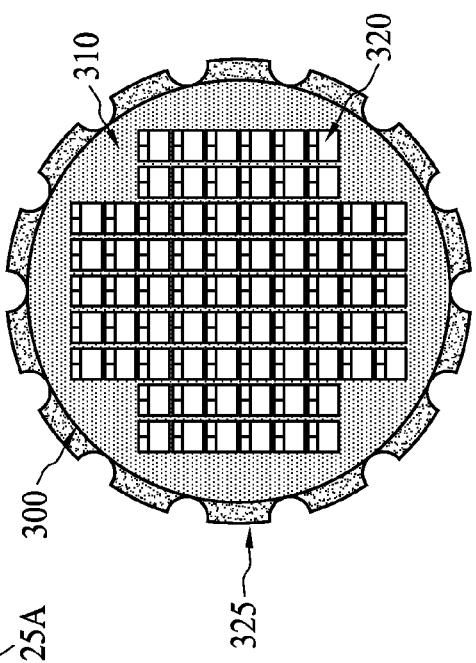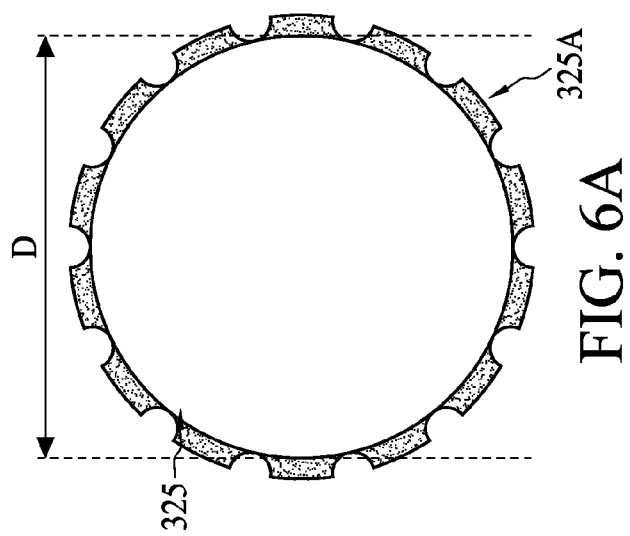
FIG. 6A
FIG. 6B
FIG. 6C

US 8,987,915 B1

SEMICONDUCTOR STRUCTURE AND MANUFACTURING METHOD THEREOF

FIELD

The disclosure relates to a structure, and more particularly to a semiconductor structure and a manufacturing method of the semiconductor.

BACKGROUND

Presently, the electronic equipments are indispensable from our daily life. Consumers increasingly demand more processing power, lower electrical power usage and cheaper devices. As the electronic industry strive to meet these demands, miniaturization, resulting in more complicated and denser configurations, extends the number of chips per wafer, the number of transistors per chip, and reduces power usage. As the electronic components are made lighter, smaller, more multifunctional, more powerful, more reliable and less expensive, a wafer level packaging (WLP) technology has been gaining in popularity. The WLP technology combines dies having different functionalities at a wafer level, and is widely applied in order to meet continuous demands toward the miniaturization and higher functions of the electronic components.

The WLP technology adopts several operations to form a structure that includes multiple layers of different materials stacking on a wafer. In contrast to a traditional packaging technology, the WLP technology is crafted in a greater scale and more complicated working environment. Some factors, such as the uniformity within the wafer is critical for each layer disposed on the wafer. An undesirable offset may lead to a malfunction of a to-be-singulated integrated circuit.

As the size of the wafer used in the WLP technology becomes greater, there are more challenges to the yield of the manufacturing. As such, improvements in the structure and method for a WLP continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross sectional views of a method placing a dummy block on a WLP semiconductor structure.

FIGS. 6A to 6C are a method of manufacturing a WLP semiconductor structure in accordance some embodiments of the present disclosure.

DETAILED DESCRIPTION OF THE INVENTION

Figure 1:
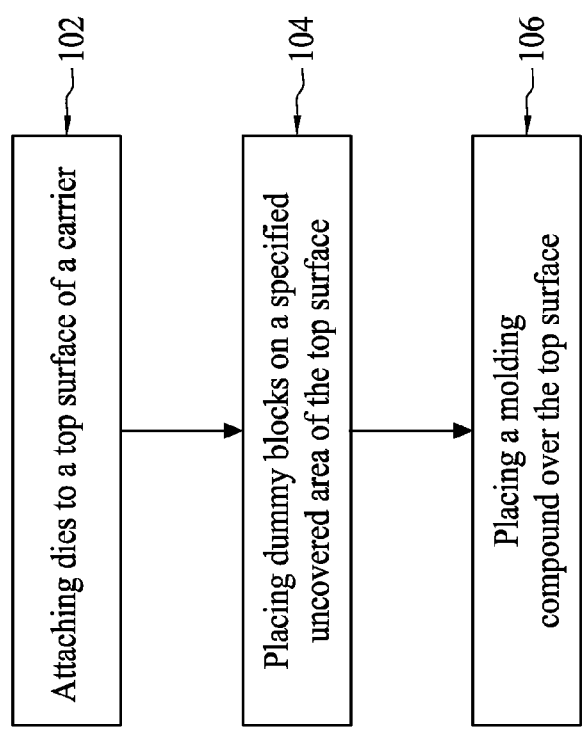
FIG. 1 is a flow diagram of a method of manufacturing a WLP semiconductor structure in accordance with some embodiments of the present disclosure.

The manufacturing and use of the embodiments are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a method is used to improve the process control of a semiconductor structure. In the method, a warpage of a WLP semiconductor structure is adjustable and the warpage of the WLP semiconductor structure is controlled in a predetermined range. In some embodiments, the warpage of the WLP semiconductor structure is controlled to be a desired curvature.

In the present disclosure, a term "carrier" is referred to a substrate used to carry some semiconductor dies (called dies hereinafter) or other components in a WLP process. Shape of the carrier is circular, polygonal or other suitable designs. Material of the carrier is silicon, glass, silicon carbide, or other suitable substance. In some embodiments, the carrier includes a silicon or glass wafer in a circular shape.

In the present disclosure, some dummy blocks are disposed on a carrier of a WLP structure for a warpage adjustment or to prevent over-warpage. The dummy blocks and some to-be-singulated dies are disposed on a surface of the carrier. In some embodiments, the warpage of the WLP semiconductor structure is adjusted to have the surface bent convexly.

In some embodiments, some dummy blocks and dies are disposed on a WLP's carrier. The coefficient of thermal expansion (CTE) of the dummy blocks is between a CTE of the carrier and a CTE of the dies. In certain embodiments, CTE of the dummy blocks is substantially equal to CTE of the dies. In the present disclosure, the term "CTE" is a property of an object. An object's length changes by an amount proportional to the original length and a change in temperature. The unit of CTE is ppm/K, which stands for $10^{-6}$ m/m Kelvin.

FIG. 1 is a flow diagram of a method of manufacturing a WLP semiconductor structure in accordance with some embodiments of the present disclosure. In operation 102, dies are attached to a top surface of a carrier. In operation 104, dummy blocks are placed on a specified uncovered area of the top surface. In operation 106, a molding compound is placed over the top surface. In some embodiments, an operation of determining the specified uncovered area is introduced before placing the dummy blocks. The various operations of FIG. 1 are discussed below in more detail in association with cross sectional views corresponding to the operations of the flow diagram.

Figure 2E:
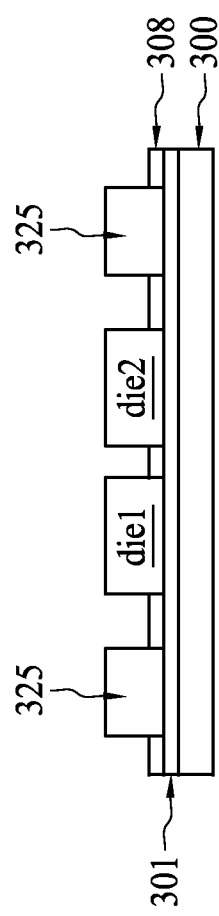
Figure 2F:
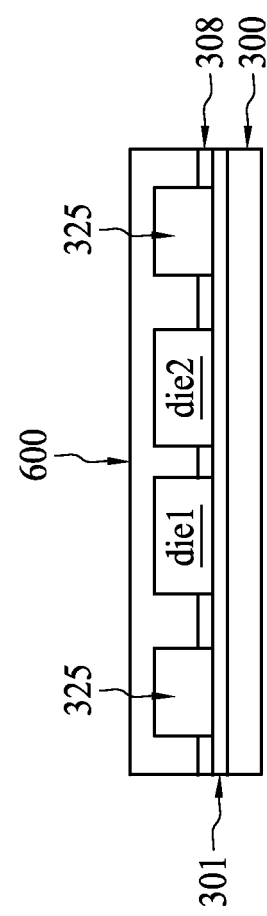

FIGS. 2A-2F are cross sectional views of a method of placing a dummy block on a WLP semiconductor structure. FIG. 2A is an operation of providing a carrier 300. The carrier 300 has a surface 302. In FIG. 2B, a light to heat conversion film (LTHC) 301 is placed on the surface 302 of the carrier 300. The LTHC 301 is decomposable after a heat, such as a laser heating, applied on the film and the carrier is thus removed from the structures attached thereon. In FIG. 2C, a die attached film (DAF) 308 is formed on the LTHC 301. In FIG. 2D, some dies, such as die 1 and die 2 in the drawing are placed on the DAF 308. In some embodiments, the DAF 308 is an adhesive and the dies are placed directly on the DAF 308. In some embodiments, die 1 is different from die 2. For example, die 1 includes only logic circuitry and die 2 includes memory arrays. In FIG. 2E, some dummy blocks 325 are placed on areas that are not covered by the dies. In FIG. 2F, a molding compound 600 is placed over the carrier 300. The dies and dummy blocks 325 are surrounded by the molding compound 600. The molding compound has a high thermal conductivity, a low moisture absorption rate, a high flexural strength at board-mounting temperatures, or a combination of these.

Figure 3B:
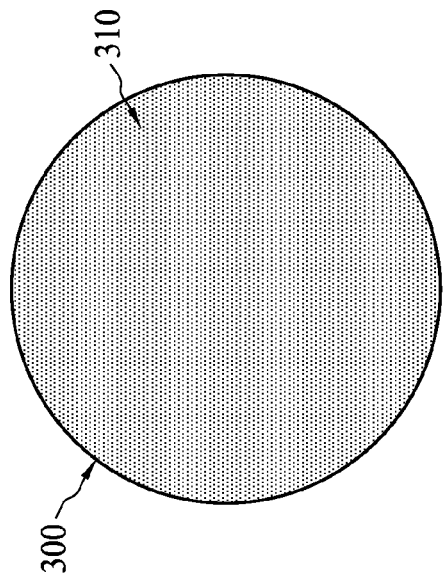
FIGS. 3A to 3D are top views of a WLP in various stages of a method of manufacturing a WLP semiconductor structure in accordance some embodiments of the present disclosure.
Figure 3D:
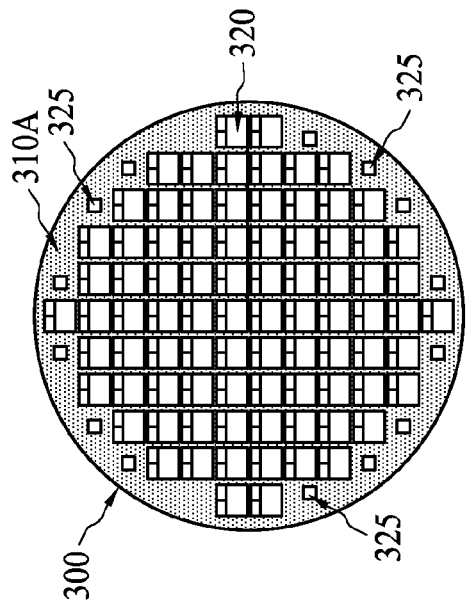
Figure 3A:
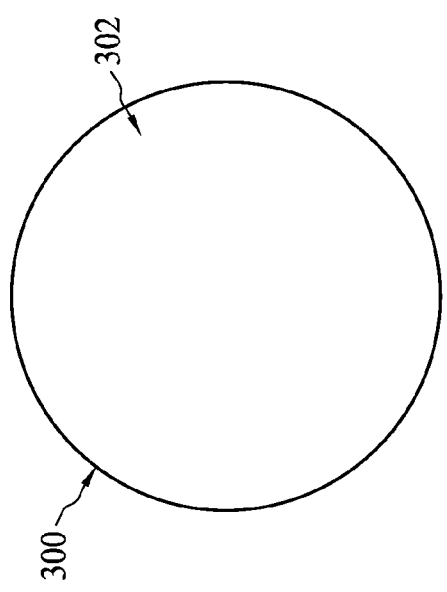
Figure 3C:
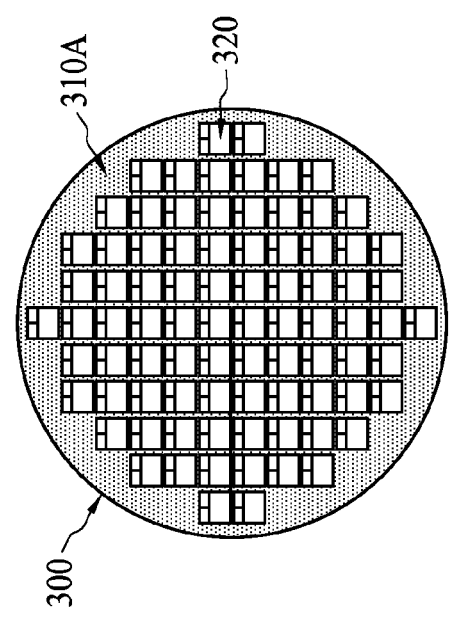

FIGS. 3A to 3D are top views of a WLP in various stages of a method of manufacturing a WLP semiconductor structure in accordance some embodiments of the present disclosure. In FIG. 3A, a carrier 300 having a surface 302 is provided. The carrier 300 has a circular shape. In FIG. 3B, a DAF is disposed on the surface 302 (not labeled because covered by the DAF) to form a new surface 310 on the carrier 300. The new surface 310 is referred as a top surface of the carrier 300 in the present embodiments. In some other embodiments, the top surface 310 is not formed by DAF but by other suitable materials. In FIG. 3C, dies 320 are attached on the DAF in an array manner. An area 310A indicates a portion of the top surface 310 that is not covered by the dies 320. In FIG. 3D, dummy blocks 325 are placed on the uncovered area 310A. In the present embodiments with reference to FIG. 3D, there are several dummy blocks 325 placed on the uncovered area 310A.

Figure 4A:
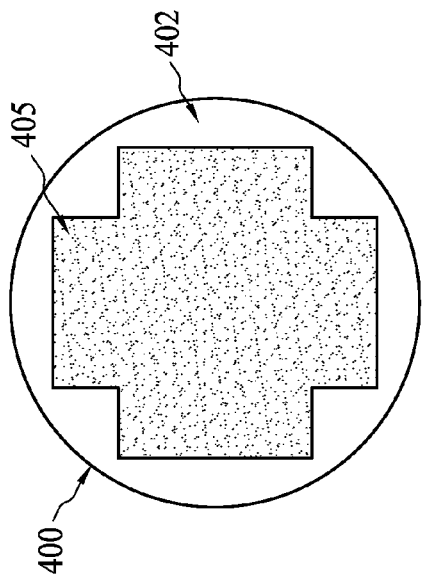
FIGS. 4A to 4G are top views and cross section views of a WLP in various stages of manufacturing in accordance some embodiments of the present disclosure.
Figure 4B:
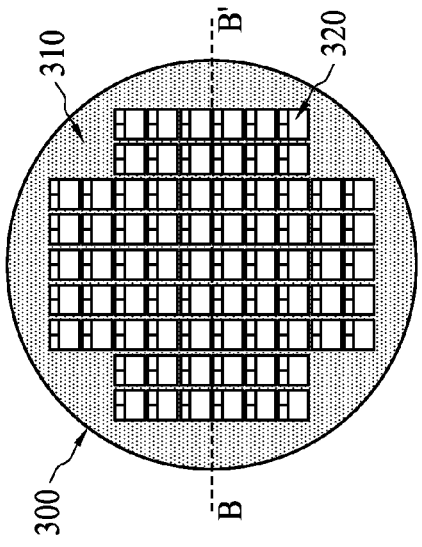
Figure 4C:
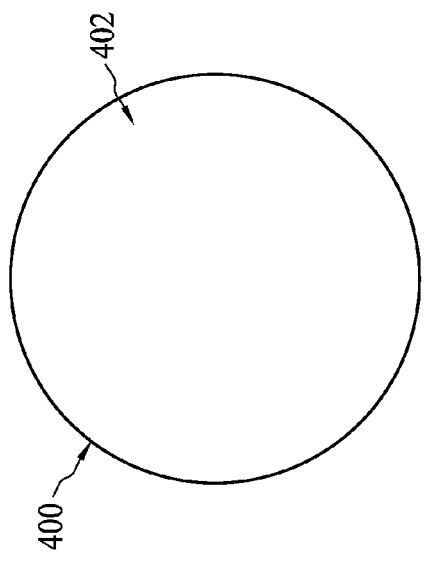
Figure 4D:
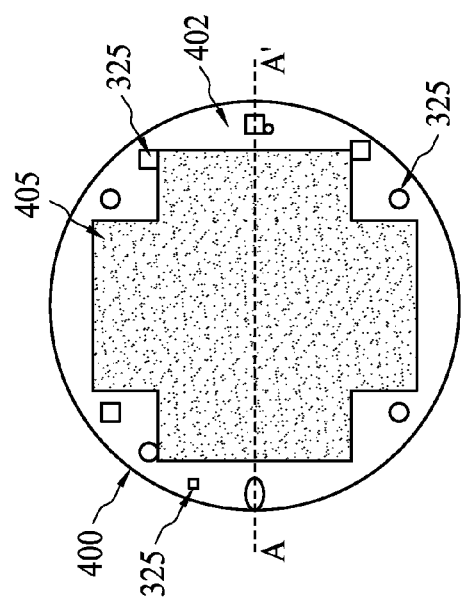
Figure 4E:
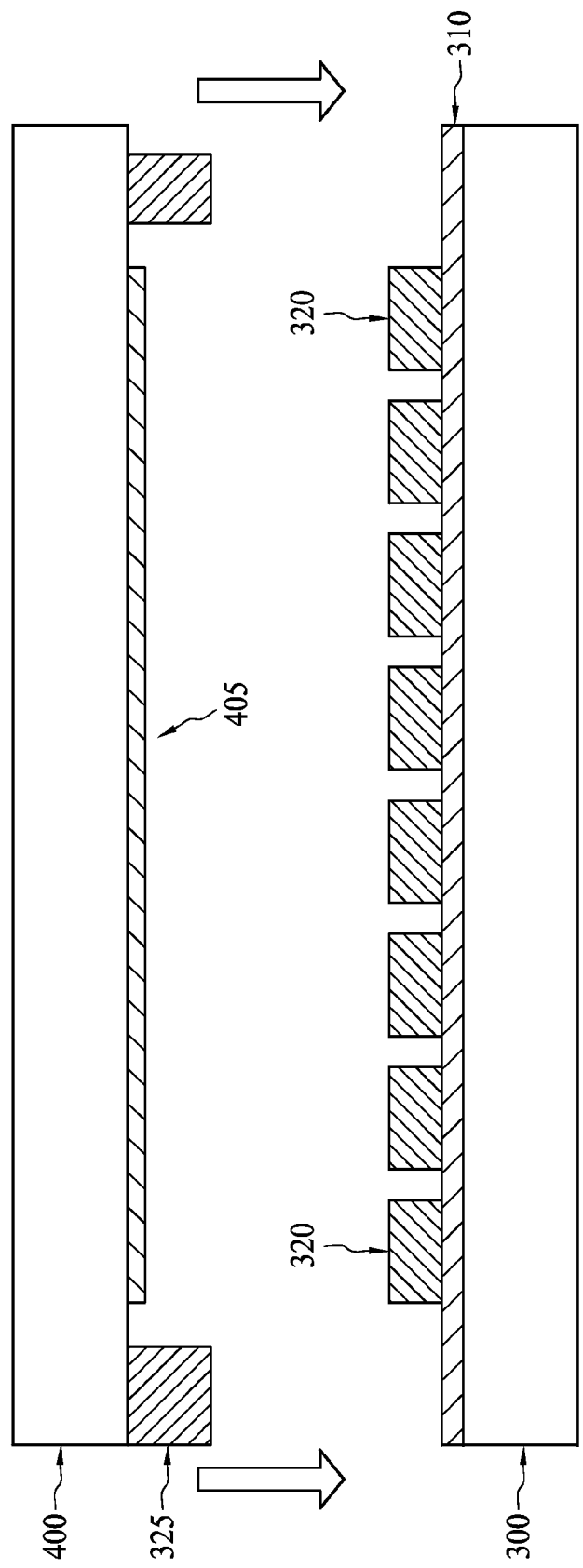
Figure 4F:
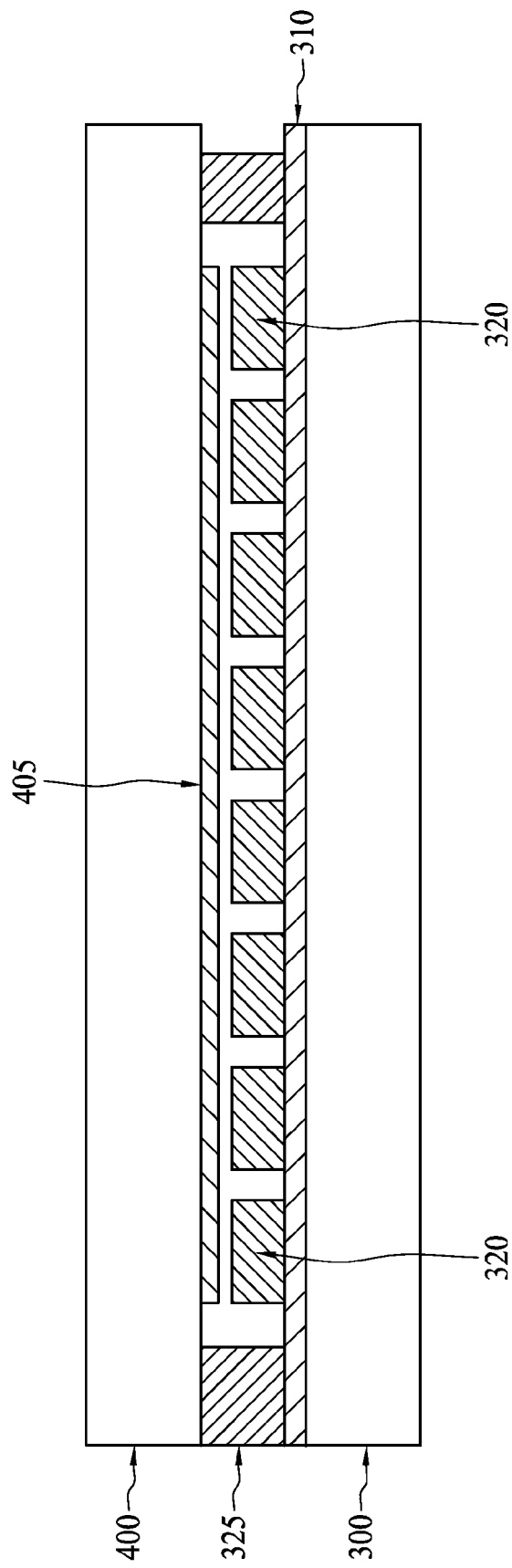

A dummy block is placed on a carrier of a WLP semiconductor structure in various ways. FIGS. 4A-4G are top views of a WLP in various stages of manufacturing. FIG. 4A is a plate 400 with a surface 402. The plate 400 includes LTHC. In FIG. 4B, a template 405 is placed on the surface 402 of the plate 400. The template 405 has a predetermined shape corresponding to a WLP semiconductor structure. In some embodiments, the template 405 is fixed to the surface 402 of the plate 400. In FIG. 4C, some dummy blocks 325 are placed on the surface 402. The dummy blocks 325 include various shapes and sizes. In some embodiments, an adhesive (not shown in the drawing) is disposed on top of each dummy block 325. In FIG. 4D, the WLP semiconductor structure corresponding to the template 405 is provided. The WLP semiconductor structure has some dies 320 placed on a carrier 300's top surface 310. FIG. 4E is a cross sectional view of plate 400 along line AA' in FIG. 4C and a cross sectional view of carrier 300 along line BB' in FIG. 4D. The plate 400 is flipped and placed over the carrier 300. The predetermined shape of the template 405 is substantially equal to the area that is covered by dies 320 on the top surface 310 of the carrier 300. In other embodiments, the predetermined shape of the template 405 is not corresponding to the WLP semiconductor structure as in FIG. 4E. In FIG. 4F, the dummy blocks 325 are contacted with the top surface 310 of the carrier 300. The dummy blocks 325 are attached on the top surface 310. In some embodiments, the dummy block 325 is attached to the top surface 310 by the adhesive pre-disposed on a surface of the dummy blocks 325.

Figure 4G:
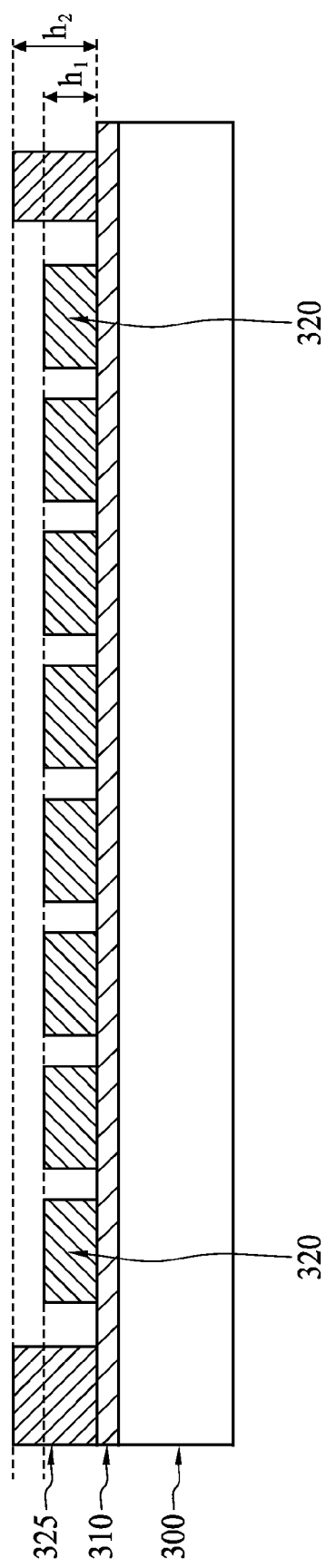

In FIG. 4G, the plate 400 and template 405 in FIG. 4F are removed. Thus, the dummy blocks 325 are left on the top surface 310. The die 320 has height $h_1$ and the dummy block 325 has a height h2. In the present embodiments, $h_2$ is greater than $h_1$. In some other embodiments, $h_2$ is equal to $h_1$. The method with reference to FIGS. 4A-4G is called as "flip placement" hereinafter.

Figure 5A:
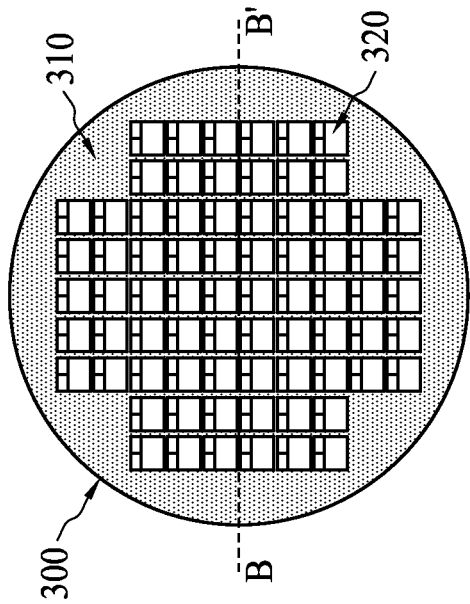
FIGS. 5A to 5E top views and cross section views of a WLP in various stages of manufacturing in accordance some embodiments of the present disclosure.
Figure 5B:
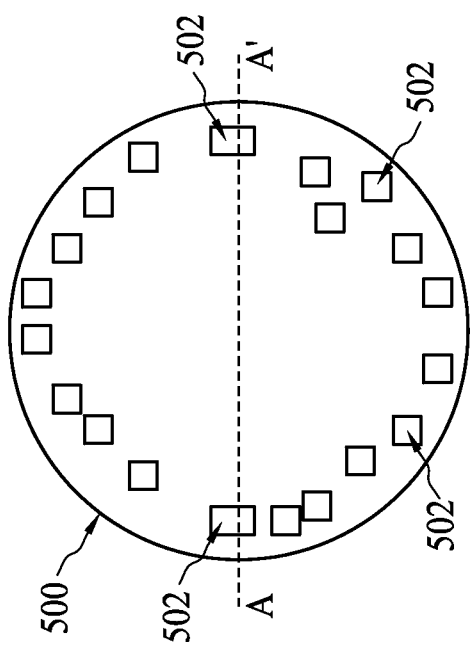
Figure 5C:
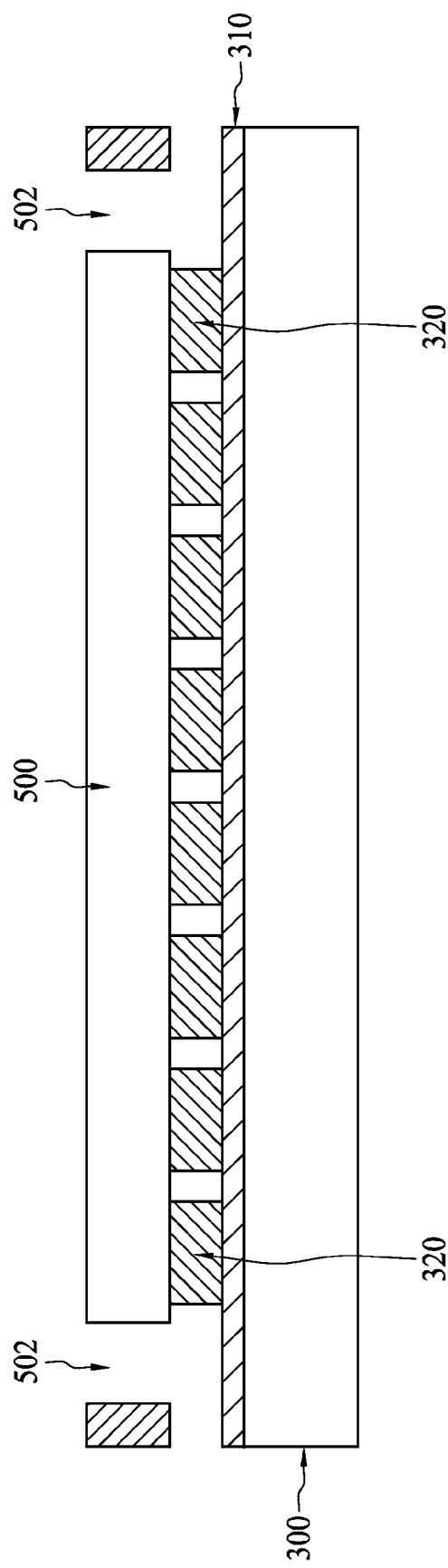
Figure 5D:
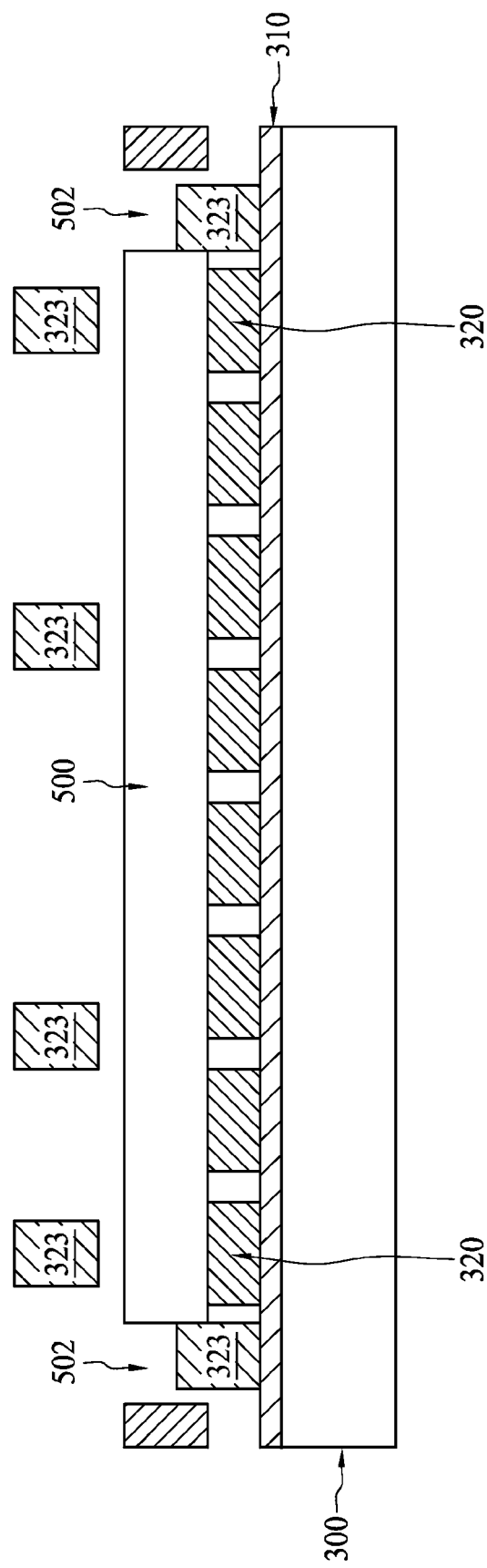
Figure 5E:
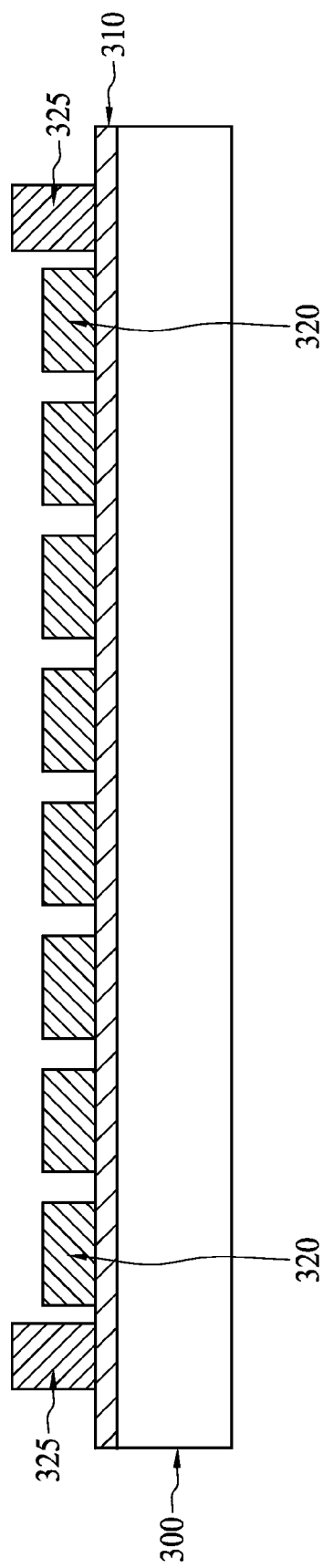

In some embodiments, a dummy block is placed on a WLP semiconductor substrate by operations referenced with FIGS. 5A to 5E. In FIG. 5A, a mask 500 is provided. Some through holes 502 are formed in the mask. In the present embodiments, the through holes 502 have various shapes. In some other embodiments, the through holes 502 are in a same shape. The through holes 502 are arranged in a predetermined pattern corresponding to a WLP semiconductor structure. In FIG. 5B, the WLP semiconductor structure corresponding to the arranged through holes 502 is provided. The WLP has dies 320 on a carrier 300. FIG. 5C is a cross sectional view of the mask 500 along line AA' in FIG. 5A and a cross sectional view of the WLP semiconductor structure 300 along line BB' in FIG. 5B. The mask 500 is placed over the dies 320. In FIG. 5D, blocks 323 are dropped on the mask 500. Some blocks 322 drop on the through holes 502 and fall on the top surface 310 of the carrier 300. Because the through holes 502 are arranged over a specified uncovered area of the top surface 310, the blocks 322 only drop on the specified uncovered area. In some embodiments, blocks 322 are pressed or pasted into the through holes 502 and fall on the mask 500. In FIG. 5E, dummy blocks 325 are formed on the specified area of the top surface 310. The method with reference to FIGS. 5A-5E is called as "stencil placement" hereinafter.

In some embodiments, a dummy block is pre-formed into a predetermined shape and dimension in corresponding to a WLP semiconductor structure. In FIG. 6A, a dummy block 325 is formed. The dummy block 325 has several teeth 325A connected to form a circular ring. The circular ring has an inner diameter D. The inner diameter D is predetermined to corresponding to a WLP semiconductor structure. In FIG. 6B, the WLP semiconductor structure corresponding to the dummy block 325 is provided. The WLP semiconductor structure has an outer diameter D'. D' is substantially equal to the inner diameter D of the dummy block 325 in FIG. 6A. In some embodiments, D' is greater than D. In FIG. 6C, the dummy block 325 is placed on the edge of the WLP semiconductor structure. In some embodiments, an operation of curing the dummy block 325 after FIG. 6C is introduced. The method with reference to FIGS. 6A-6C is called as "pre-formation" hereinafter.

In some embodiments, the pre-formed dummy block is a circular ring without teeth on its edge. In some embodiments, the carrier of the WLP semiconductor structure has a quadrilateral shape. Thus, the pre-formed dummy block has a quadrilateral shape in corresponding to the carrier.

In some embodiments, dummy blocks are placed on a carrier of a WLP semiconductor structure by at least two aforementioned methods. In certain embodiments, some dummy blocks are placed on the carrier by the stencil placement and some other dummy blocks are placed on the carrier by the flip placement. In certain embodiments, a dummy block is placed on an edge of the WLP semiconductor structure by the pre-formation and some dummy blocks are placed over the carrier by the stencil placement.

Figure 7:
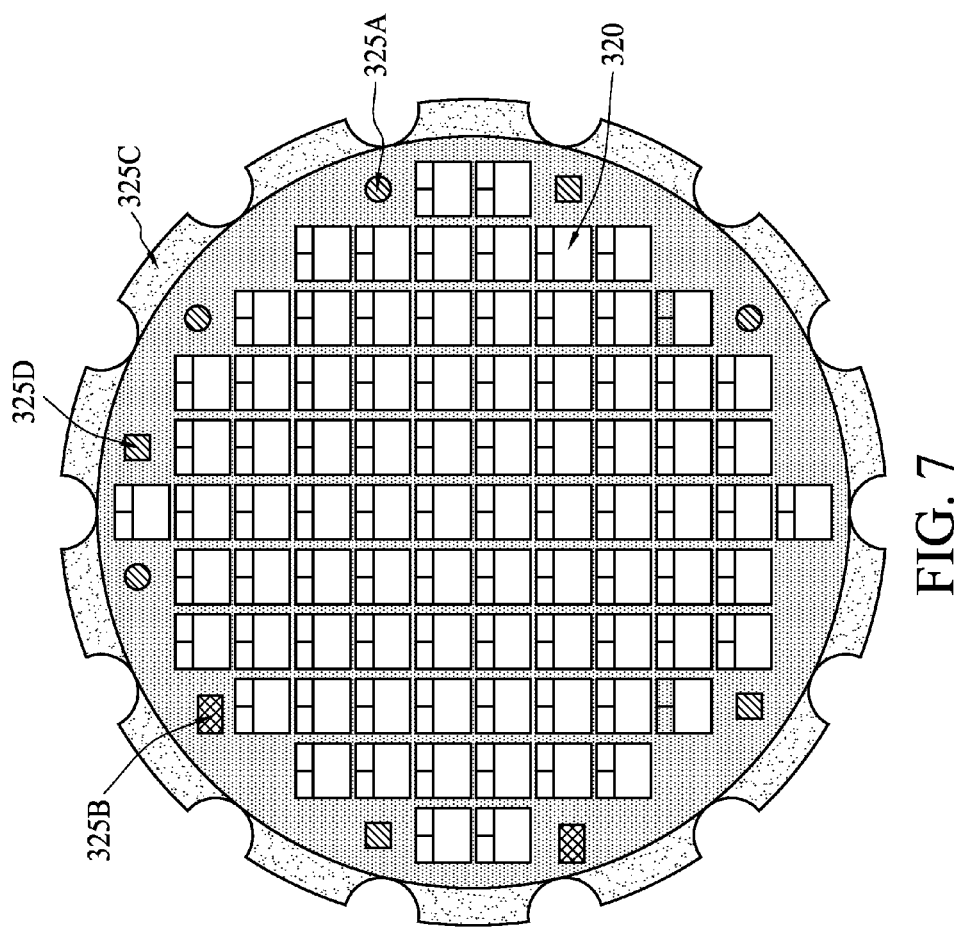
FIG. 7 is a WLP semiconductor structure in accordance some embodiments of the present disclosure.

In FIG. 7, a WLP semiconductor structure 100 has some dies 320 and some dummy blocks such as 325A, 325B, 325C and 325D. The dummy block 325A has a conical shape; the dummy block 325B has a rectangular shape; the dummy block 325C has a ring shape; and the dummy block 325D has a square shape. In some embodiments, dummy blocks 325A are placed on the WLP semiconductor structure 100 by the flip placement. Dummy blocks 325B and 325D are placed on the WLP semiconductor structure 100 by the stencil placement. Dummy block 325C is placed on the WLP semiconductor structure 100 by the pre-formation.

Figure 8:
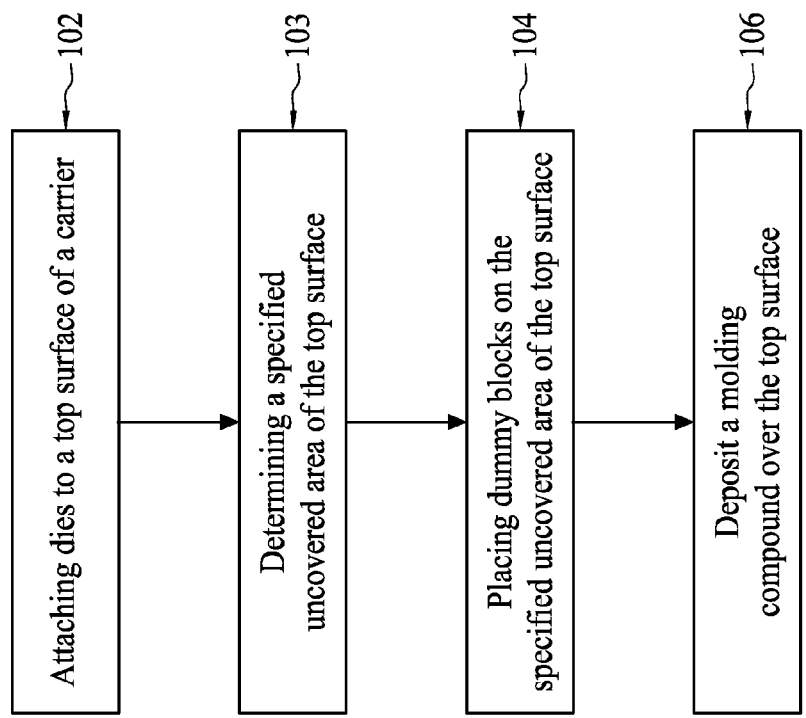
FIG. 8 is a flow diagram of a method of manufacturing a WLP semiconductor structure in accordance with some embodiments of the present disclosure.

FIG. 8 is a flow diagram of a method of manufacturing a WLP semiconductor structure in accordance with some embodiments of the present disclosure. In operation 102, dies are attached to a top surface of a carrier. In the present method, an operation 103 of determining a specified uncovered area of the top surface is introduced before an operation 104. In the operation 104, some dummy blocks are placed on a specified uncovered area of the top surface. In operation 106, placing a molding compound over the top surface. In some embodiments, an operation of determining the specified uncovered area is introduced before the operation 102.

Figure 9A:
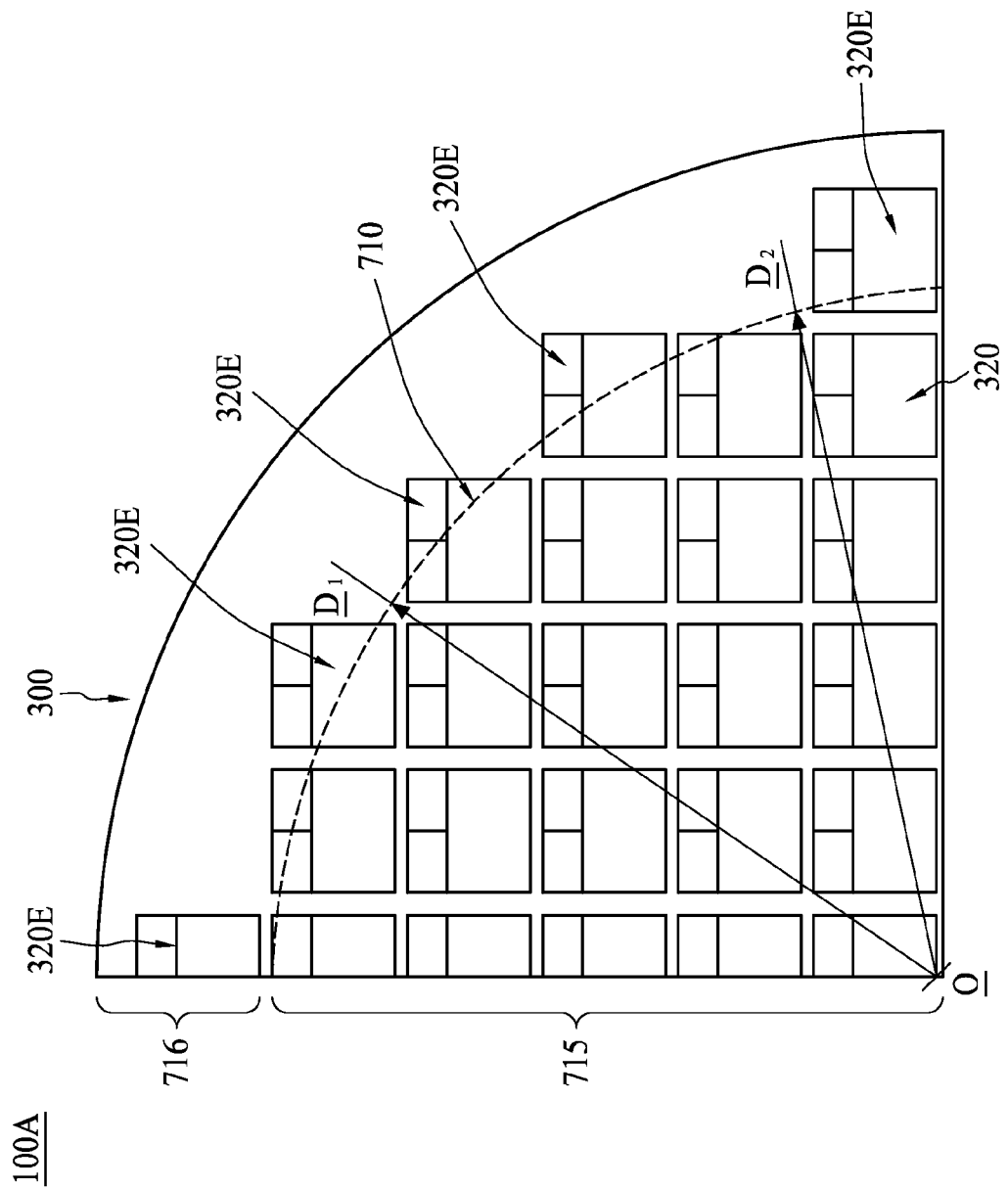
FIG. 9A is a top view of a WLP semiconductor structure in accordance with some embodiments of the present disclosure.

Determining the specified uncovered area of the top surface includes categorizing dies on a carrier into two different zones or defining different zones on a top surface of the carrier. FIG. 9A is a top view of a portion of a WLP structures that is used to show some embodiments for categorizing dies and defining zones of a carrier. There are several dies 320 placed on a carrier 300. The center of the WLP semiconductor structure is labeled as "O" is the drawing. The dies 320 include an edge die 320E that is defined as a die that is adjacent to only one or two dies. A die is adjacent to another die when the dies share an edge. A length D including $D_1$ and $D_2$ on the top surface of the carrier 300 represents a distance measured from an intersection 330 of two edge dies 320E to the center O. An intersection is where two edge dies share a corner. When more than one corner is shared, such as for the edge dies that are also adjacent, only the closest corner to the center is the intersection. While many intersection 330 of two edge dies may be found on one WLP semiconductor structure, the length D is measured from the intersection 330 that is closest to the center O. In some embodiments, the carrier 300 is a circle and the length D is a portion of a radius of the carrier 300. In some embodiments when $D_1$ is different from $D_2$, the length D is an average of lengths $D_1$ and $D_2$ from different intersections 330. The length D is the mean value of $D_1$ and $D_2$. When there are more than two different lengths, the length D is the mean value of all different lengths. In some embodiments, the length D is determined to be a peripheral inset distance from the edge of the carrier, as opposed to a distance from the center.

A boundary 710 is determined to separate the dies 320 into two zones. For a circular carrier, the boundary 710 is a circle having a radius length D. A first zone 715 is defined as a region between the origin O and the boundary 710. A second zone 716 is defined as a region between the boundary 710 and the edge of the carrier 300.

Figure 9B:
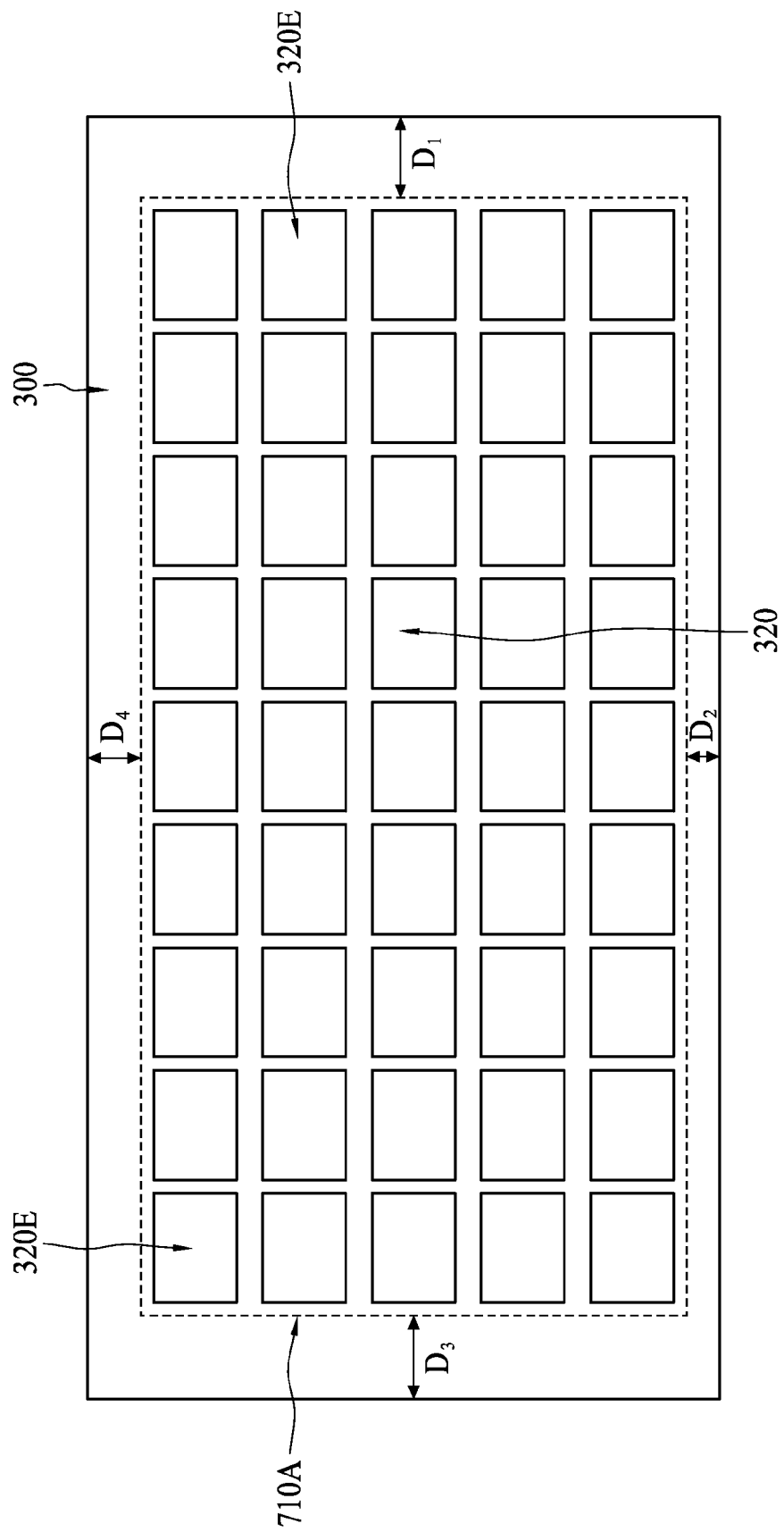
FIG. 9B is a top view of a WLP semiconductor structure in accordance with some embodiments of the present disclosure.

In some embodiments, the boundary is defined by a distance from an edge die to the edge of the carrier. As in FIG. 9B, the carrier 300 is in a quadrilateral shape. Dies 320 including edge dies 320E are disposed on the carrier 300. A boundary 710A is defined by a peripheral inset distance to each edge die 320E. In certain embodiments, the peripheral inset distance to each edge die is smaller than 20% of the largest dimension of the dummy block to be placed on. For dummy block in a circular shape, the largest dimension is the diameter of the dummy block. For dummy block in a rectangular shape, the largest dimension is the longest edge of the dummy block. The peripheral inset distance can be different for each edge die. As in FIG. 9B, there are four different peripheral inset distances, $D_1, D_2, D_3,$ and $D_4$ to determine the boundary 710A.

In some embodiments, a coverage ratio of each abovementioned categorized or defined zone is calculated to determine the specified uncovered area. The coverage ratio is defined as dividing a total die area in one zone with the carrier's top surface area in the same zone.

Figure 10:
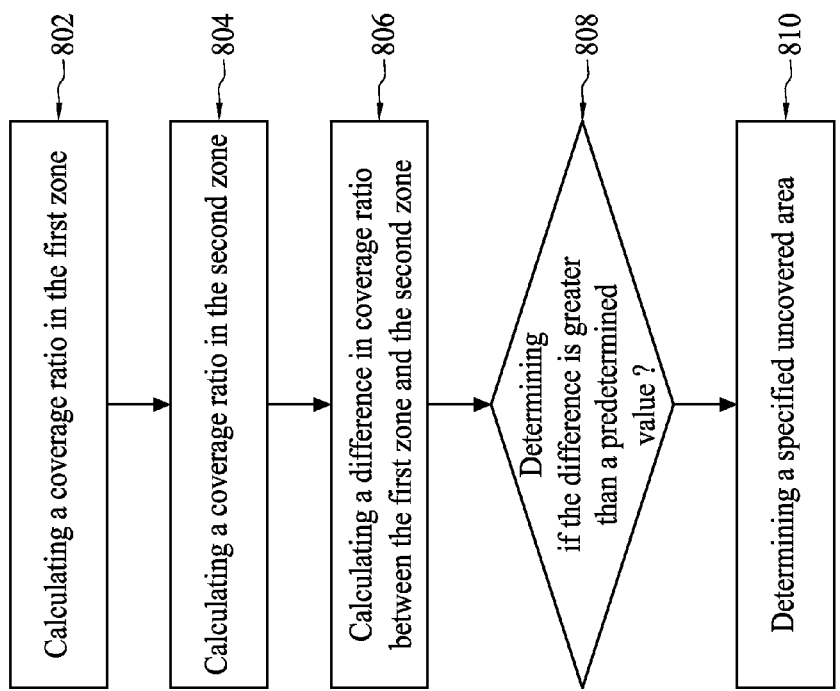
FIG. 10 is a flow chart including some operations of determining the specified uncovered area.

FIG. 10 is a flow chart including some operations of determining the specified uncovered area by considering the coverage ratio of each defined zone. In operation 802, a coverage ratio in the first zone 715 is calculated to be as $R_1$. In operation 804, a coverage ratio in the second zone 716 is calculated to be as $R_2$. In operation 806, a coverage ratio difference between $R_1$ and $R_2$ is calculated. In operation 808, the coverage ratio difference is compared with a predetermined value P. If the coverage ratio difference is greater than P, a specified uncovered area is determined in operation 810. The specified uncovered area is determined to be a location in a zone with the lower coverage ratio. For example, if the coverage ratio in the first zone 715 is greater than the coverage ratio in the second zone 716, i.e. $R_1 > R_2$, the specified uncovered area is located in the second zone 716.

In some embodiments, the predetermined value P is about 30%. In one example, the first zone's coverage ratio is about 81% and the second zone's coverage ratio is about 37%. A coverage ratio difference between the two zones is about 47%, which is grater than P. Some locations in the second zone 716 are determined to be an uncovered area for placing a dummy block or dummy blocks thereon. The coverage ratio, R2, of the second zone is increased after placing the dummy block on the uncovered area. In the example, $R_2$ is increased to about 51%. Thus, the coverage ratio difference between the first and second zone is reduced to be about 30%, which is equal to P. As such, warpage of the WLP semiconductor structure is adjusted. In some embodiments, the predetermined value P is smaller than 30%, and is, for example, 25%, 16%, 10%, etc.

In some embodiments, the predetermined value P is about 10%. In one example, the first zone's coverage ratio is about 76% and the second zone's coverage ratio is about 91%. A coverage ratio difference between the two zones is about 15%, which is grater than P. Some locations in the first zone 715 are determined to be an uncovered area for placing a dummy block or dummy blocks thereon. The coverage ratio, R1, of the first zone 715 is increased after placing the dummy block on the uncovered area. In this example, $R_1$ is increased to about 85%. Thus, the coverage ratio difference between the first and second zone is reduced to be about 6%, which is smaller than P. As such, warpage of the WLP semiconductor structure is adjusted.

Figure 11:
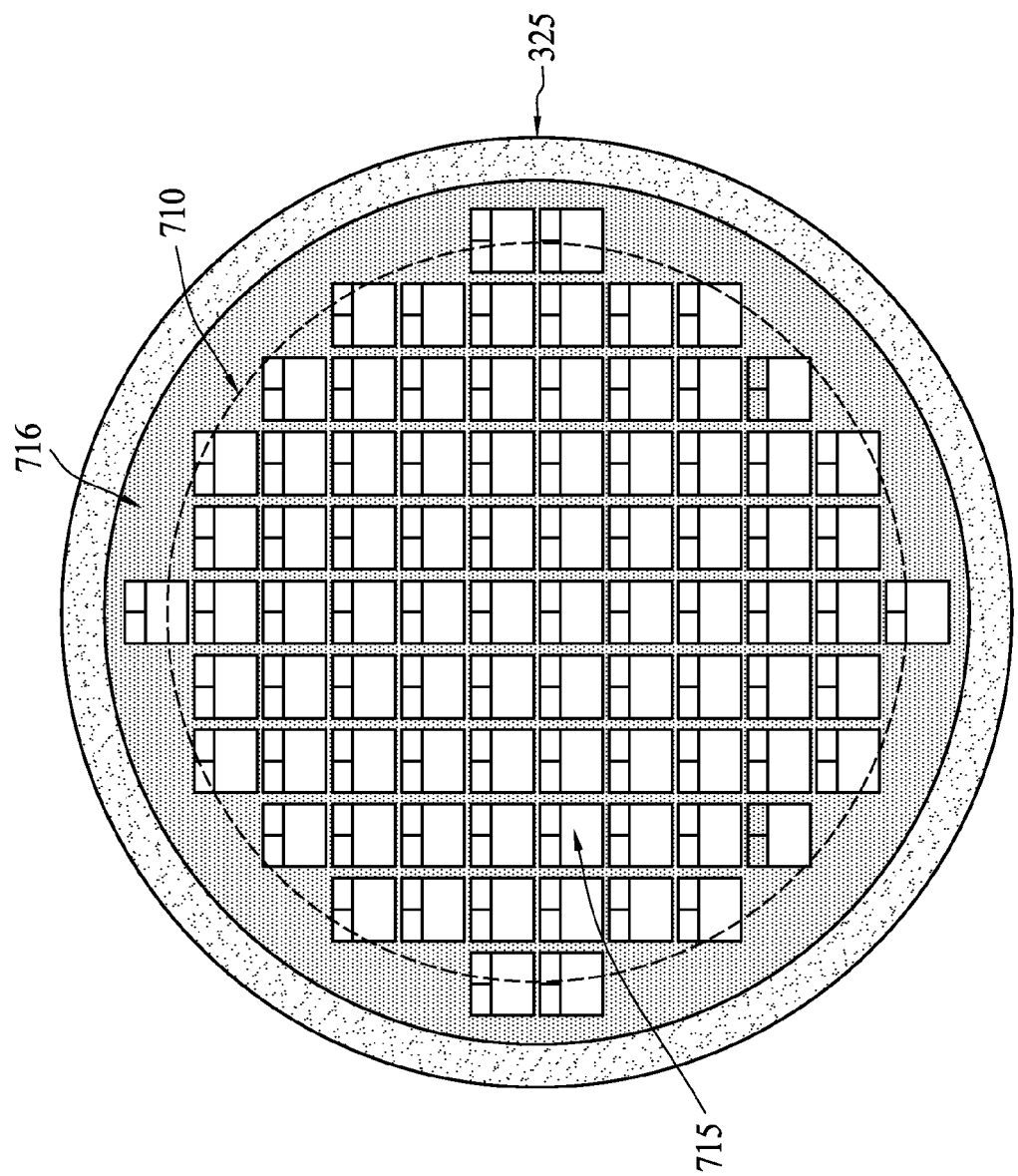
FIG. 11 is a drawing of some embodiments having a dummy block placed at the edge of a WLP semiconductor structure.

FIG. 11 is a top view of a WLP semiconductor structure having a dummy block at the edge. A boundary 710 is selected to define the WLP semiconductor structure into a first zone 715 and a zone 716. The zone 716 is between the boundary 710 and the WLP's edge. A dummy block 325 is placed in the second zone 716 and close to the edge of the WLP semiconductor structure. The dummy block 325 increases the area coverage ratio in the second zone 716. Thus, warpage of the WLP semiconductor structure is adjusted.

In some embodiments, the specified uncovered area is determined to be in various locations in both zones. For example, a top surface of a WLP semiconductor structure is defined into a first zone and a second zone. The first zone has an area coverage ratio about 89%. The second zone has an area coverage ratio about 67%. The coverage ratio difference is about 22%. The predetermined value P is about 13%. Some locations in the first zone are defined as a first uncovered area and some locations in the second zone are defined as a second uncovered area. Dummy blocks are placed on the first uncovered area to increase the area coverage ratio from about 89% to 93%. Some other dummy blocks are placed on the second uncovered area to increase the area coverage ratio from about 67% to about 83%. Thus, the coverage ratio difference is reduced from about 22% to about 10% (93%-83%).

Figure 12:
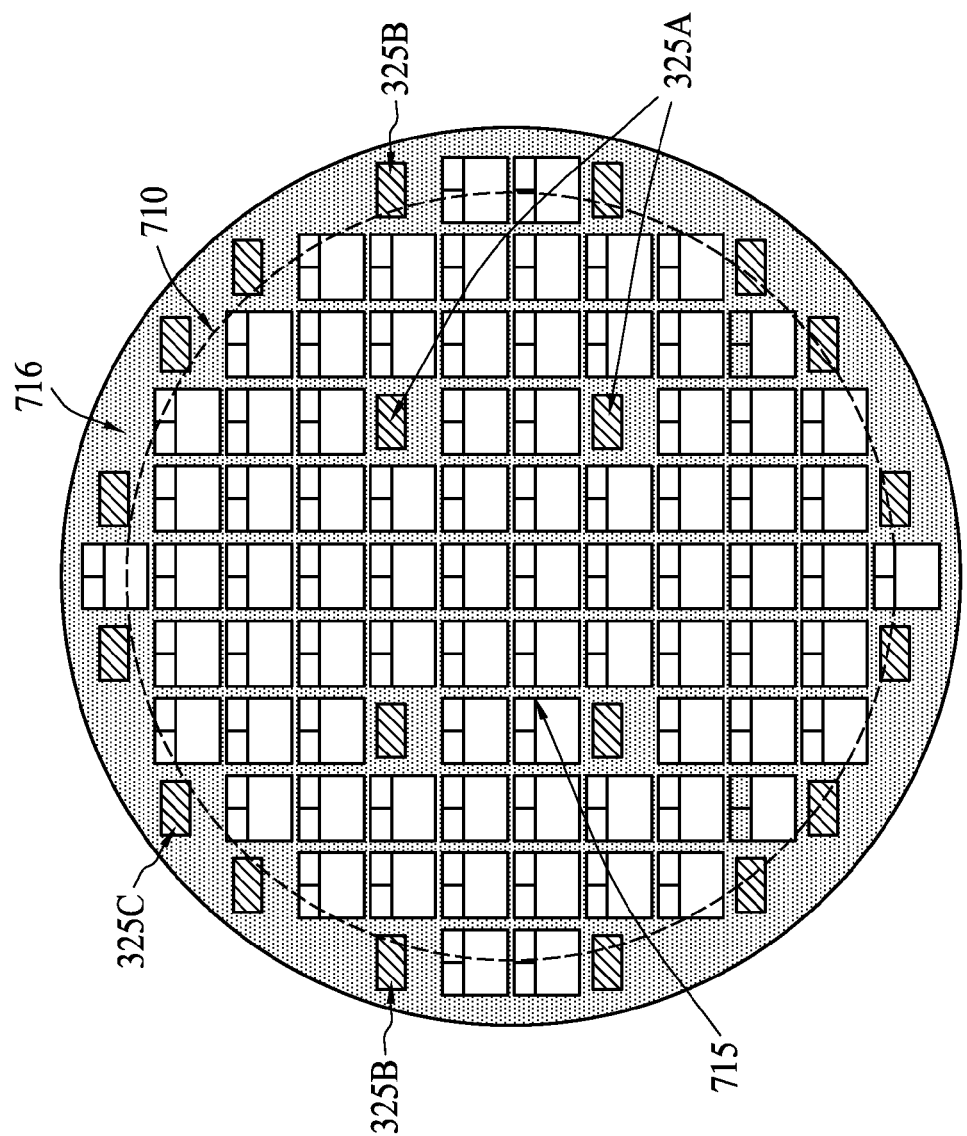
FIG. 12 is a WLP semiconductor structure having dummy blocks in a first zone and a second zone.

In some embodiments, the specified uncovered area is determined to be in some locations covering both zones. FIG. 12 is a WLP semiconductor structure having dummy blocks in both a first zone 715 and a second zone 716. Dummy blocks 325A are placed in the first zone 715. Some dummy blocks, such as 325B are placed in the second zone 716. Some dummy blocks, such as 325C are placed across the boundary 710.

Figure 13:
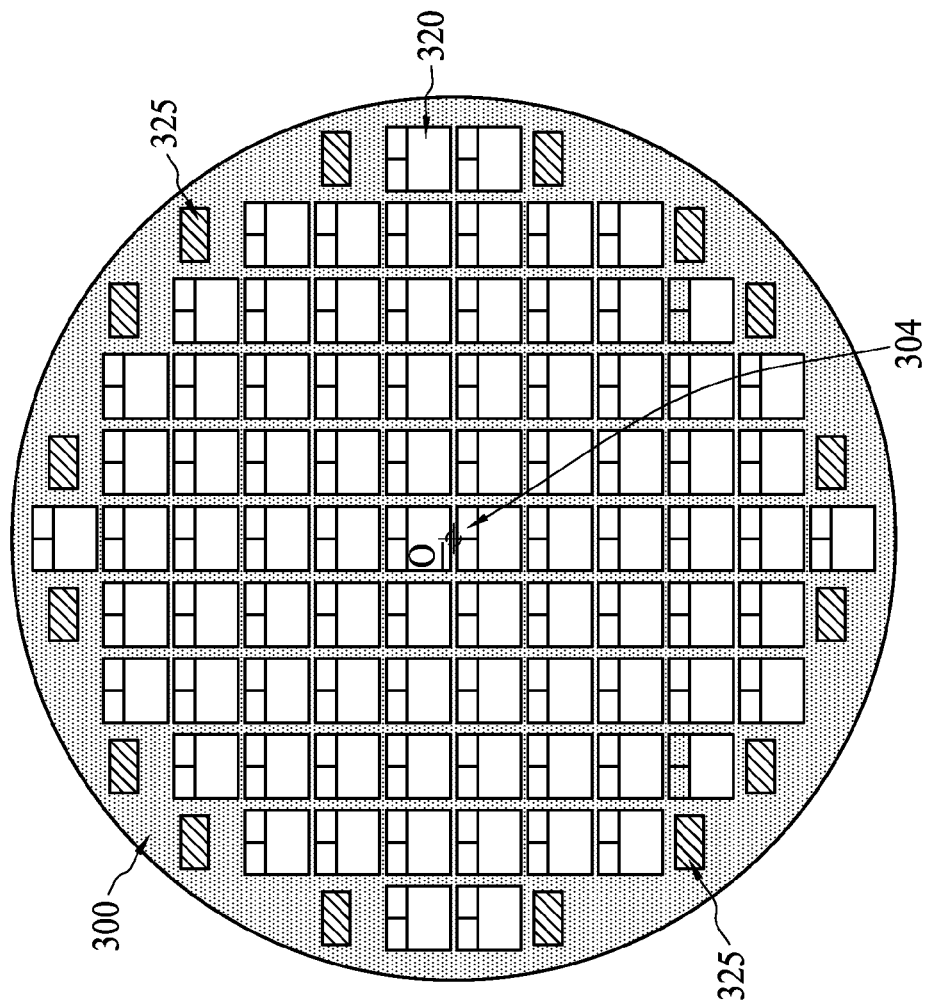
FIG. 13 is a WLP semiconductor structure in accordance with some embodiments of the present disclosure.
Figure 14:
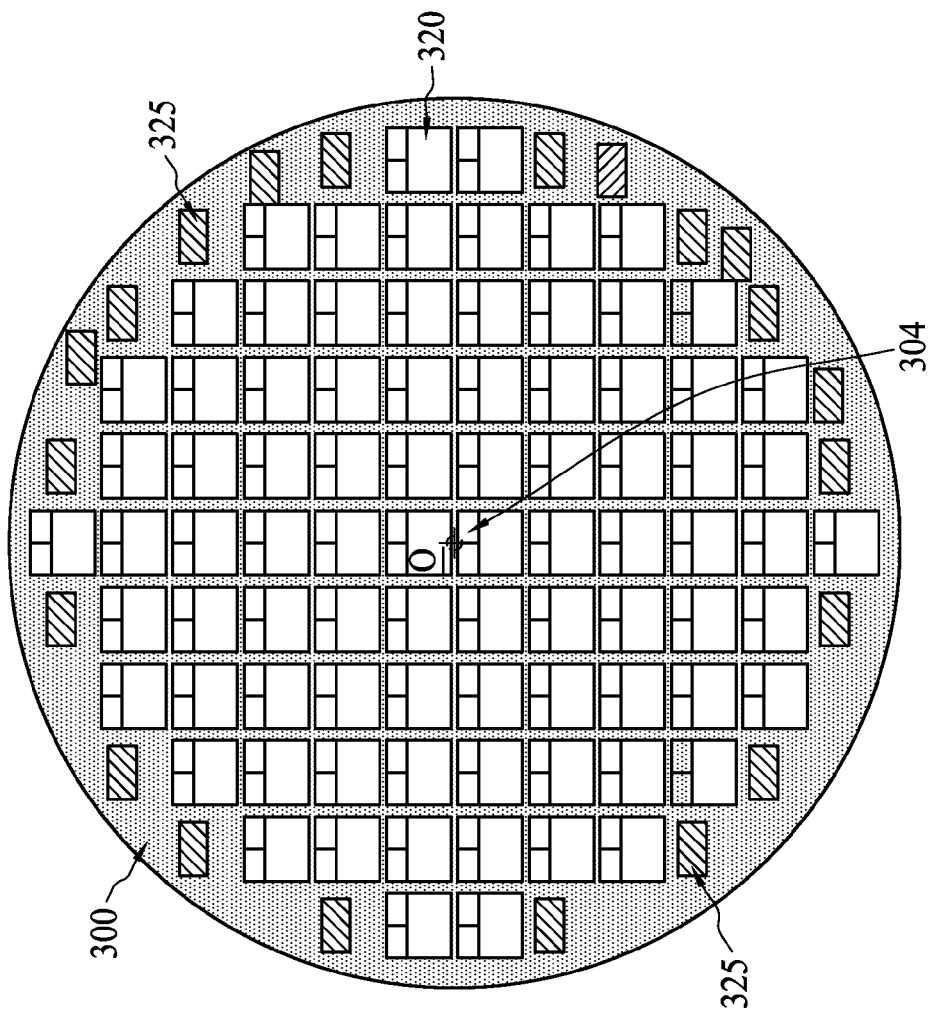
FIG. 14 is a WLP semiconductor structure in accordance with some embodiments of the present disclosure.

In the present disclosure, there is no limitation on the arrangement of the specified uncovered area or dummy blocks on the WLP semiconductor structure as long as the warpage of the WLP semiconductor structure is adjusted to a desired range. In some embodiments, the specified uncovered area is arranged symmetrically to a center of a WLP semiconductor structure. FIG. 13 is a WLP semiconductor structure 100 having a carrier 300. The carrier 300 has a center 304. Some dies 320 are placed on the carrier 300. Dummy blocks such as 325 are placed symmetrically to the center 304. In some embodiments, the specified uncovered area is arranged in a random manner on WLP semiconductor structure. FIG. 14 is a WLP semiconductor structure 100 having a carrier 300. The carrier 300 has a center 304. Dies 320 are placed on the carrier 300. Dummy blocks such as 325 are placed randomly to the center 304. There is no specific pattern for the arrangement of the specified covered area.

Figure 15:
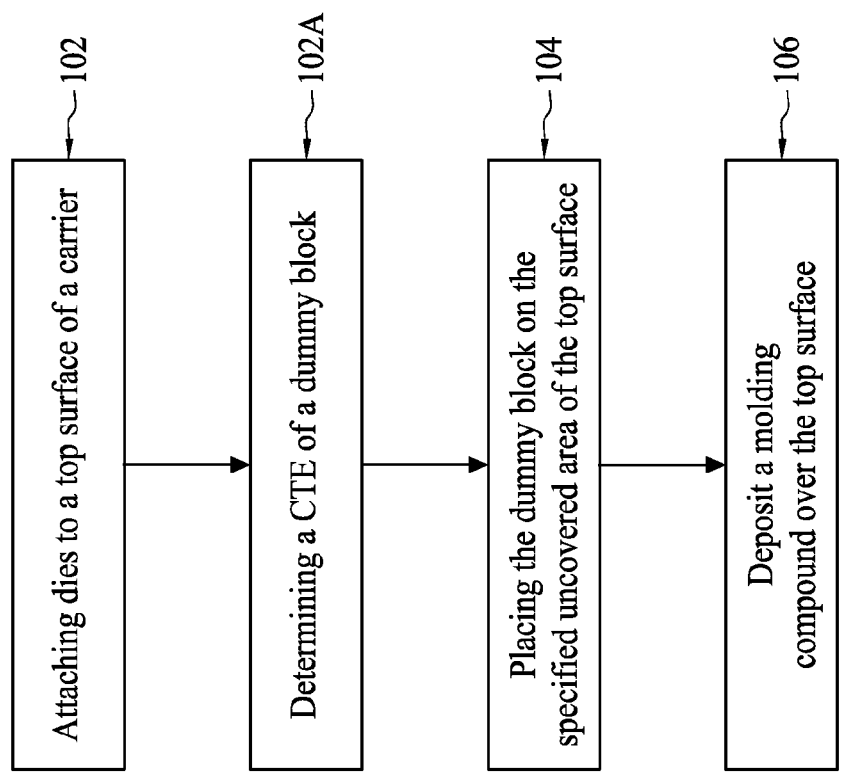
FIG. 15 is a flow diagram of a method of manufacturing a WLP semiconductor structure in accordance with some embodiments of the present disclosure.

FIG. 15 is a flow diagram of a method of manufacturing a WLP semiconductor structure in accordance with some embodiments of the present disclosure. In operation 102, some dies are attached to a top surface of a carrier. In the present method, an operation 102A of determining a CTE of a dummy block is introduced before an operation 104. In the operation 104, some dummy blocks are placed on a specified uncovered area of the top surface. In operation 106, depositing a molding compound over the top surface. In some embodiments, the operation 102A is introduced before the operation 102.

In some embodiments, the CTE of the dummy block is determined by a CTE of the dies and a CTE of the carrier. The CTE of the dummy block is between the CTE of the dies and the CTE of the carrier. In certain embodiments, the dies are made with silicon, which has a CTE around 3 ppm/K. The carrier is glass made with silicon dioxide, which has a CTE between around 3 ppm/K and 11 ppm/K. in other embodiments, the material of the dummy block has a CTE around 2.5 ppm/K. In certain embodiments, the dummy block is a rubber or a polymer material such as epoxy, polyimide, polybenzoxazole (PBO), and the like.

In some embodiments, the CTE of the dummy block is substantially equal to the CTE of the dies. In certain embodiments, the dies are made with silicon, which has a CTE around 3 ppm/K. The carrier is glass made with silicon dioxide, which has a CTE around 3.7 ppm/K. The material of the dummy block has a CTE around 3 ppm/K.

In some embodiments, an operation of determining a CTE of the carrier is introduced before the operation 102. In certain embodiments, an effective CTE of the dies in the operation 102 and the molding compound in the operation 106 determine the CTE of the carrier. The effective CTE is calculated in accordance with the CTE of each element and the weighting factor of that element. For example, in certain embodiments, the dies are silicon having a CTE around 3 ppm/K; the molding compound is an epoxy, which has a CTE around 55 ppm/K. The effective CTE is calculated by the following formula:

$$\text{Alpha(effective CTE)} = (V1*E1*A1 + V2*E2*A2)/(E\text{eff});$$

wherein the Eeff (Effective Yonug's Modulus)=V1E1+V2E2; V1 and V2 is respectively a volume fraction of a first material and a second material. In some embodiments, the first material is silicon and the second material is molding compound. E1 and E2 is the Young's modulus of the first material and the second material. A1 and A2 is the CTE of the first material and the second material.

According to some embodiments of the present disclosure, a method of manufacturing a semiconductor structure includes several operations. One operation includes attaching a plurality of dies to a top surface of a carrier. On operation includes placing a plurality of dummy blocks on a specified uncovered area of the top surface. One operation includes placing a molding compound over the top surface of the carrier. The plurality of dummy blocks has a coefficient of thermal expansion (CTE) between a CTE of the plurality of dies and the carrier.

Figure 16:
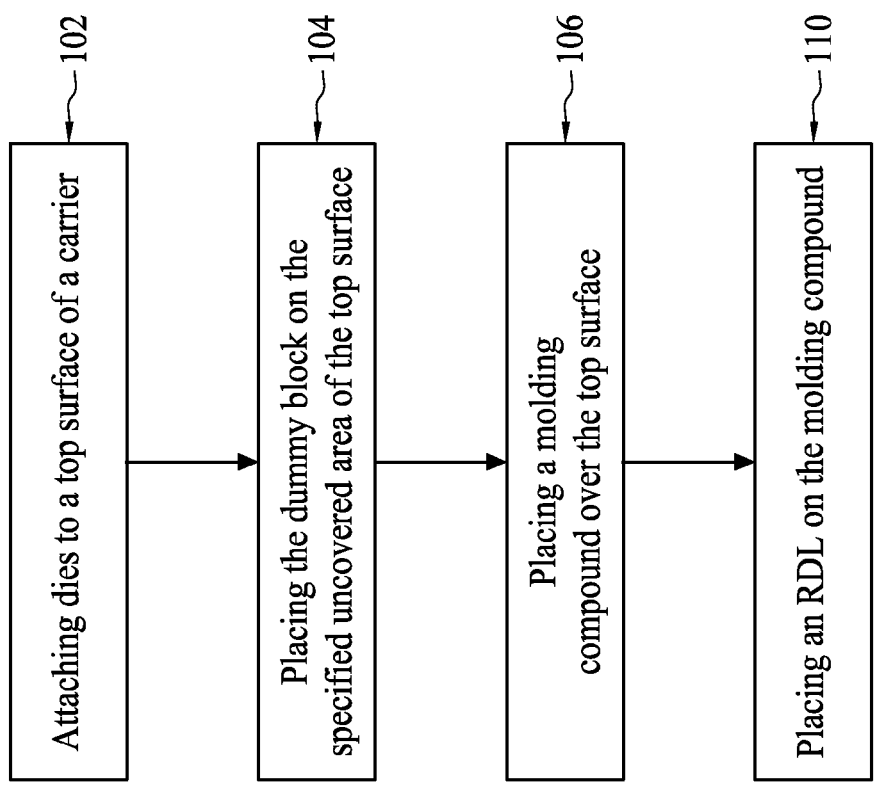
FIG. 16 is a flow diagram of a method of manufacturing a WLP semiconductor structure in accordance with some embodiments of the present disclosure.

FIG. 16 is a flow diagram of a method of manufacturing a WLP semiconductor structure in accordance with some embodiments of the present disclosure. In operation 102, some dies are attached to a top surface of a carrier. In operation 104, some dummy blocks are placed on a specified uncovered area of the top surface. In operation 106, depositing a molding compound over the top surface. In some embodiments, an operation of determining the specified uncovered area is introduced before placing the dummy block thereon. In operation 108, the molding compound is grounded to have the dummy block and the dies exposed. In operation 110, a redistribution layer (RDL) is placed on the molding compound and electrically connected with the dies.

The RDL is formed with gold, silver, copper, nickel, tungsten, aluminum, and/or alloys, or other suitable materials. The operation of forming an RDL includes forming a conductive material on the molding compound and pattering the conductive material into conductive interconnects. It is required to have a controlled warpage for the WLP semiconductor structure in order to patterning the conductive material into a desired pattern of the RDL.

Figure 17:
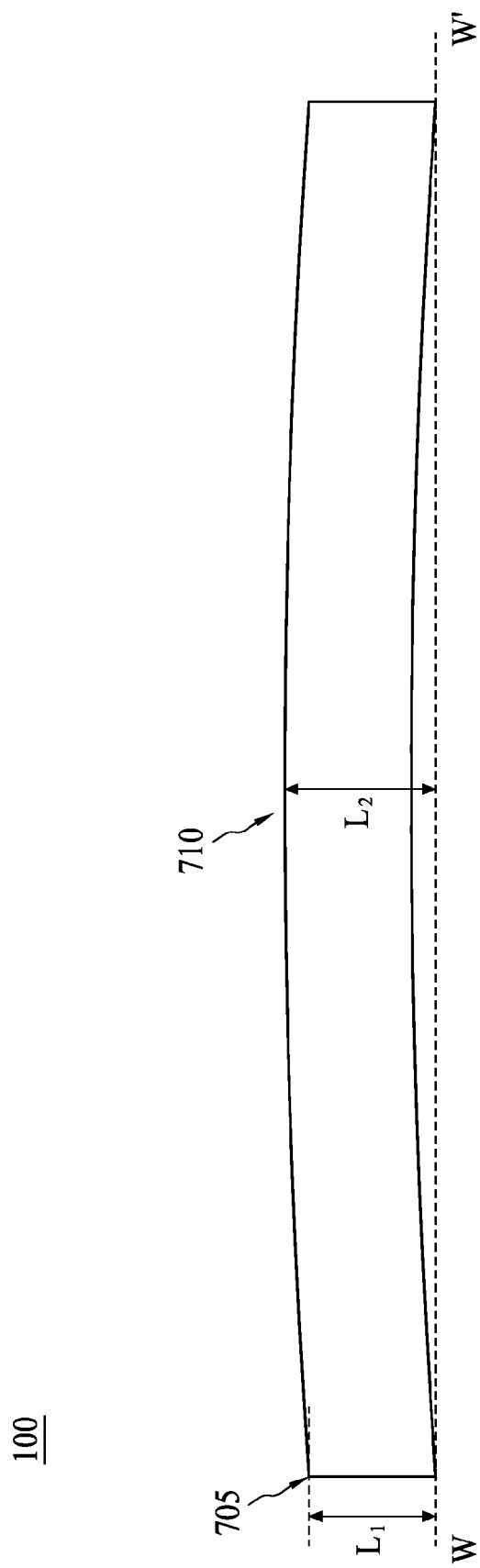
FIG. 17 is a WLP semiconductor structure having a warpage in accordance to some embodiments of the present disclosure.

Warpage of a WLP semiconductor structure is defined as in FIG. 17. An exemplary WLP semiconductor structure 100 has a highest point 710 and a lowest point 705 on its surface. Line WW' is used as a baseline to measure a vertical distance to the highest point 710 and the lowest point 705. The highest point 710 has a distance $L_2$ from line WW' and the lowest point 705 has a distance $L_1$ from line WW. Warpage of the WLP semiconductor structure is defined by subtracting $L_2$ from $L_1$. Warpage in a positive value means the top surface of the WLP semiconductor structure 100 is bent convexly as in FIG. 17. In one example, the warpage is 200 μm, which means $L_2$-$L_1$=200 μm. When the warpage is a negative value, the WLP semiconductor structure 100 is concave.

In some embodiments, some dummy dies are placed on the WLP semiconductor structure to make the warpage of the WLP semiconductor structure substantially equal to 0, which means that the WLP semiconductor structure has a flat surface. In some embodiments, some dummy dies are placed on the WLP semiconductor structure to make the warpage of the WLP semiconductor structure substantially equal to 100 μm, which means that the top surface (where the dummy is put on) of the WLP semiconductor structure is convex by 100 μm. In contrast, a negative wargape value means that the top surface of the WLP semiconductor structure in concave. In some embodiments, some dummy dies are placed on the WLP semiconductor structure to make the warpage of the WLP semiconductor structure substantially equal to 250. In some embodiments, some dummy dies are placed on the WLP semiconductor structure to make the warpage of the WLP semiconductor structure substantially equal to 500. In some embodiments, the WLP semiconductor structure 100 has a warpage between about 0 and 500. In certain embodiments, a convex top surface of the WLP semiconductor structure provides a larger window for the proceeding patterning and metallization process.

Figure 18:
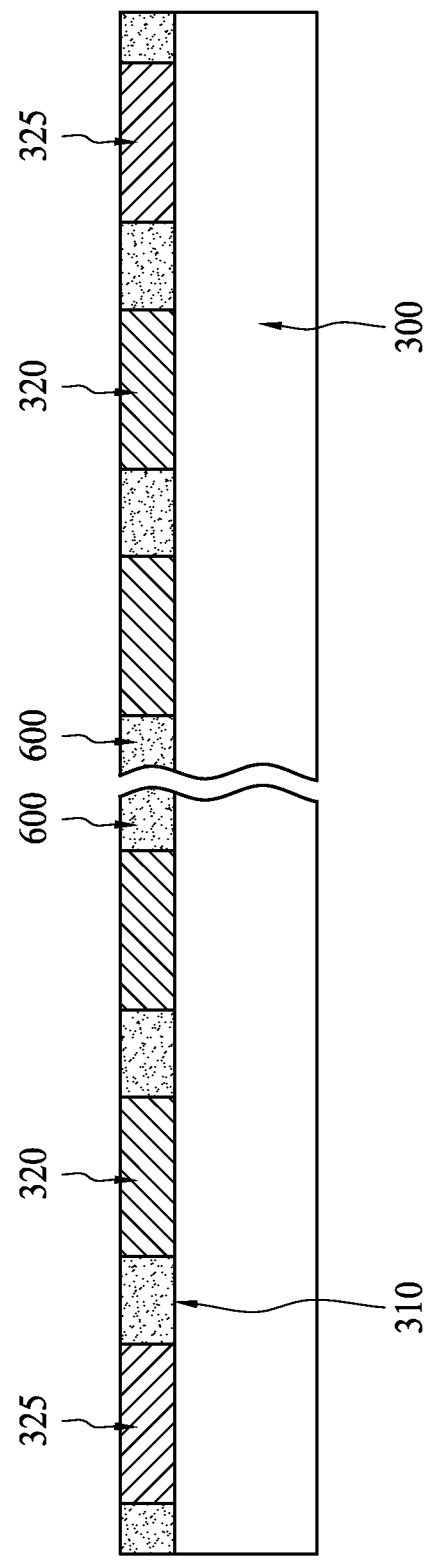
FIG. 18 is a WLP semiconductor structure with some dummy blocks disposed on a top surface in accordance to some embodiments of the present disclosure.

FIG. 18 is a WLP semiconductor structure 100 in accordance to some embodiments of the present disclosure. The WLP semiconductor structure 100 has a carrier 300. The carrier 300 has some dies 320 on a top surface 310 of the carrier 300. Some dummy blocks 325 are disposed on the top surface 310. A molding compound 600 is on the top surface 310 and surrounds the dies and dummy blocks 325. The dummy blocks 325 adjust the warpage of the WLP semiconductor structure 100. In the present embodiments, the top surface 310 is substantially flat.

The WLP semiconductor structure has a total coverage that is defined as dividing the area covered by the dies 320 with the area of the top surface 310. In certain embodiments, the total coverage is between about 30% to about 95%.

In certain embodiments, the dummy block include silicon, silicon oxide, silicon nitride, aluminum oxide, metal alloy, solder paste and other suitable material. The dummy block has a CTE between about 2.5 ppm/K and 10 ppm/K.

Figure 19:
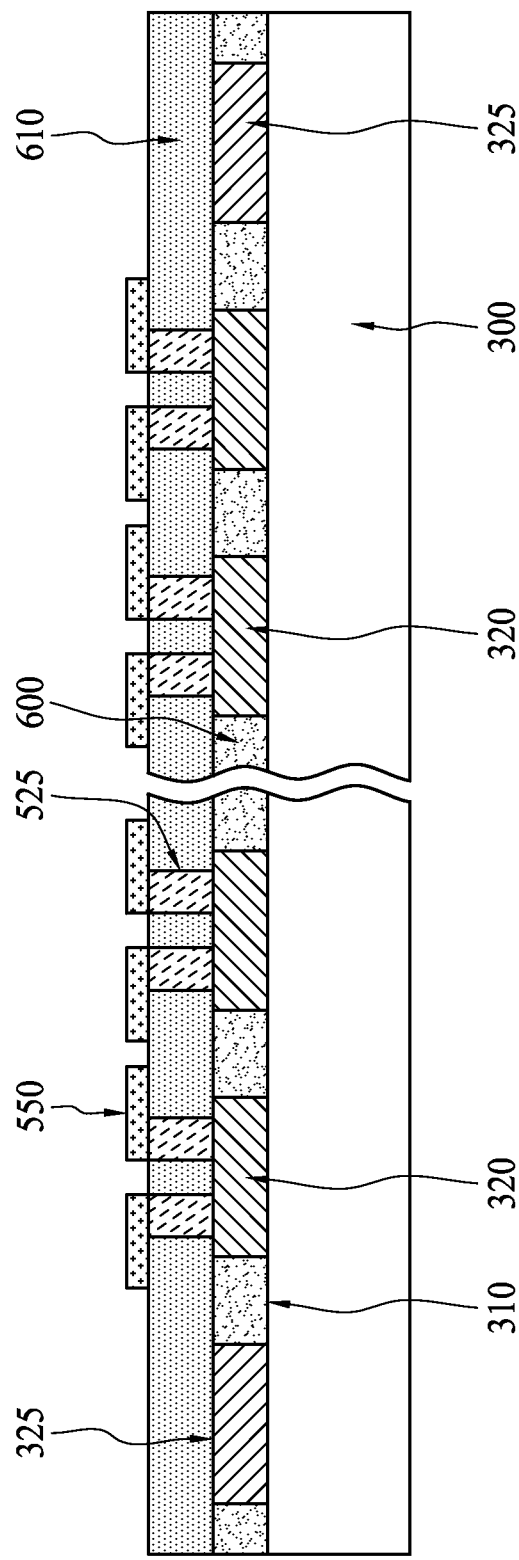
FIG. 19 is a WLP semiconductor structure with RDLs disposed over a top surface in accordance to some embodiments of the present disclosure.

FIG. 19 is a WLP semiconductor structure 100 in accordance to some embodiments of the present disclosure. The WLP semiconductor structure 100 has a dielectric 610 on the molding compound 600. The dielectric 610 includes silicon oxide, silicon oxynitride, silicon nitride, epoxy, polyimide, PBO, and other suitable material. There are several conductive pillars 525 in the dielectric 610. The conductive pillar 525 is electrically connected with a die 325 at one end. The conductive pillar is formed with a conductive material such as gold, silver, copper, nickel, tungsten, aluminum, tin and/or alloys thereof. An RDL 550 is on the dielectric 610. The RDL 550 is connected with the conductive pillar 525 at one end.

Figure 20:
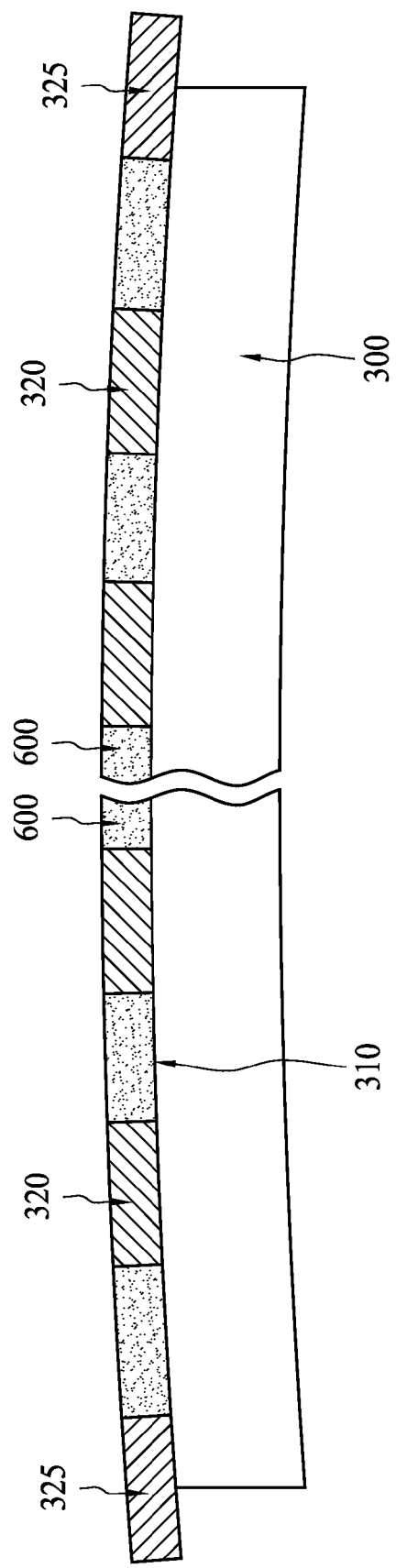
FIG. 20 is a WLP semiconductor structure having a warpage in accordance to some embodiments of the present disclosure.

FIG. 20 is a WLP semiconductor structure in accordance to some embodiments of the present disclosure. The WLP semiconductor structure is similar to the WLP semiconductor structure 100 in FIG. 16. The WLP semiconductor structure has a dummy block 325 at edges of the carrier 300. The dummy block 325 is a ring around the edge and it shows as two blocks in a cross sectional view as in FIG. 18. The WLP semiconductor structure has a warpage because CTE mismatch. The warpage is adjusted by the dummy block to have a desired shape. In some embodiments as in FIG. 18, the warpage of the WLP semiconductor structure is adjusted to make the top surface 310 become a convex surface.

Figure 21:
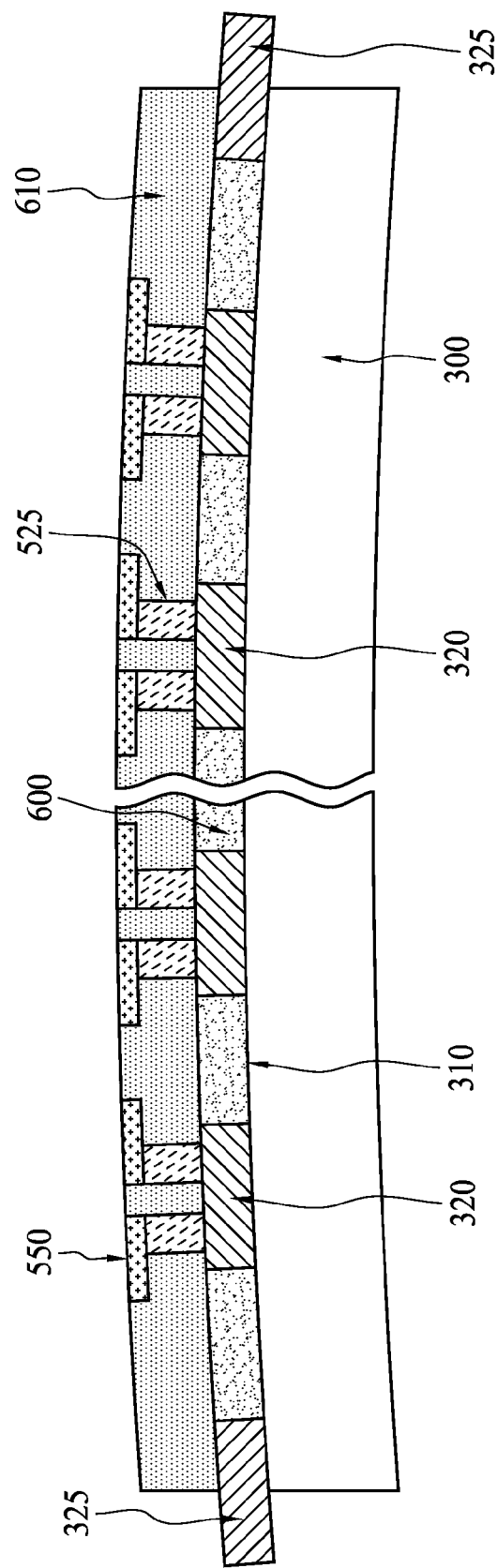
FIG. 21 is a WLP semiconductor structure having a warpage and RDL in accordance to some embodiments of the present disclosure.

FIG. 21 is a WLP semiconductor structure in accordance to some embodiments of the present disclosure. The WLP semiconductor structure has a warpage and has RDL 550 on a dielectric 610.

According to some embodiments of the present disclosure, a method of manufacturing a semiconductor structure includes several operations. The method includes attaching a plurality of dies to a top surface of a carrier; placing a dummy block on a specified uncovered area of the top surface; and depositing a molding compound over the top surface of the carrier. The dummy block has a coefficient of thermal expansion (CTE) between a CTE of the dies and the carrier.

In certain embodiments, a method of manufacturing a semiconductor structure includes determining the specified uncovered area.

In certain embodiments, a method of manufacturing a semiconductor structure includes categorizing the plurality of dies into two different zones.

According to some embodiments of the present disclosure, a method of manufacturing a semiconductor structure includes several operations. An operation includes placing a plurality of dies on a carrier. An operation includes defining a first zone and a second zone in a top surface of the carrier. An operation includes calculating a first coverage ratio in the first zone. An operation includes calculating a second coverage ratio in the second zone. An operation includes disposing a dummy block on a specified location of the top surface of the carrier if the difference between the first coverage ratio and the second coverage ratio is greater than a predetermined value. An operation includes forming a molding compound on the carrier.

In certain embodiments, a method of manufacturing a semiconductor structure includes calculating an efficient coefficient of thermal expansion of the semiconductor structure.

In certain embodiments, a method of manufacturing a semiconductor structure includes defining a boundary between the first zone and the second zone.

In certain embodiments, a method of manufacturing a semiconductor structure includes defining a boundary between the first zone and the second zone includes determining a length on the top surface of the carrier, wherein the length is a shortest distance measured from an intersection of two edge dies to a center of the carrier.

According to some embodiments of the present disclosure, a semiconductor wafer level package has several features. A feature includes a carrier. A feature includes several dies on the carrier. A feature includes a dummy block on a specified location on the carrier not covered by a die. A feature includes a molding compound on the carrier.

The methods and features of this invention have been sufficiently described in the above examples and descriptions. It should be understood that any changes, substitutions, alterations or modifications without departing from the spirit of the invention are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method of manufacturing a semiconductor structure, comprising:
   attaching a plurality of dies to a top surface of a carrier;
   placing a dummy block on a specified uncovered area of the top surface;
   depositing a molding compound over the top surface of the carrier;
   wherein the block has a coefficient of thermal expansion (CTE) between a CTE of the plurality of dies and the carrier.

2. The method in claim 1, wherein a total coverage of the plurality of dies on the top surface of the carrier is between about 30% and about 95%.

3. The method in claim 1, wherein the dummy block includes silicon.

4. The method in claim 1, wherein the dummy block forms a ring shape pattern.

5. The method in claim 1, wherein the specified uncovered area is adjacent to at least two dies of the plurality of dies.

6. The method in claim 1, wherein the specified uncovered area is located at an edge of the carrier.

7. The method in claim 1, further comprising determining the specified uncovered area.

8. The method in claim 7, wherein the determining the specified uncovered area includes categorizing the plurality of dies into two different zones.

9. The method of claim 8, wherein the determining the specified uncovered area further comprises determining a boundary between the two different zones.

10. A method of manufacturing a semiconductor structure, comprising:
    placing a plurality of dies on a carrier;
    defining a first zone and a second zone in a top surface of the carrier ;
    calculating a first coverage ratio in the first zone;
    calculating a second coverage ratio in the second zone;
    disposing a dummy block on a specified location of the top surface of the carrier if the difference between the first coverage ratio and the second coverage ratio is greater than a predetermined value; and,
    forming a molding compound on the carrier.

11. The method in claim 10, wherein the predetermined value is greater than 25%.

12. The method in claim 10, further comprising calculating an efficient coefficient of thermal expansion of the semiconductor structure.

13. The method in claim 10, further comprising defining a boundary between the first zone and the second zone.

14. The method in claim 13, wherein the defining a boundary between the first zone and the second zone includes determining a length on the top surface of the carrier, wherein the length is a shortest distance measured from an intersection of two edge dies to a center of the carrier.

15. The method in claim 10, wherein the dummy block has a polygonal shape.

16. The method in claim 10, wherein the dummy block has a conical shape.

17. The method in claim 10, further comprising forming a redistribution layer (RDL) over the carrier.

18. A semiconductor wafer level package, comprising:
    a carrier;
    a plurality of dies on a top surface of the carrier;
    a dummy block on a specified location of the top surface of the carrier not covered by a die; and
    a molding compound on the carrier;
    wherein the dummy block has coefficient of thermal expansion (CTE) between a CTE of the plurality of dies and the carrier.

19. A semiconductor wafer level package, comprising:
    a carrier;
    a plurality of dies on the carrier;
    a dummy block on a specified location on the carrier not covered by a die; and
    a molding compound on the carrier;
    wherein the carrier has an effective CTE, wherein the effective CTE is determined by a CTE of the plurality of dies and the molding compound.

20. The semiconductor wafer level package of claim 18 further comprising a coverage ratio of the plurality dies on the carrier, wherein the coverage ratio of the plurality dies on the carrier is between about 30% to 95%.

* * * * *